United States Patent [19]

Mori

[11] Patent Number: 5,318,456
[45] Date of Patent: Jun. 7, 1994

[54] SOCKET

[75] Inventor: Ikuo Mori, Gotenba, Japan

[73] Assignee: Texas Instruments Incorporated, Dallas, Tex.

[21] Appl. No.: 54,941

[22] Filed: Apr. 30, 1993

Related U.S. Application Data

[63] Continuation of Ser. No. 893,488, Jun. 5, 1992, abandoned.

[30] Foreign Application Priority Data

Jul. 19, 1991 [JP] Japan ................. 3-203217

[51] Int. Cl.⁵ ........................................ H01R 13/62
[52] U.S. Cl. ........................... 439/266; 439/331
[58] Field of Search ............ 439/70, 71, 72, 73, 439/264, 265, 266, 268, 330, 331, 525, 526

[56] References Cited

U.S. PATENT DOCUMENTS

| | | | |
|---|---|---|---|
| 4,527,850 | 7/1985 | Carter | 439/330 |
| 4,630,875 | 12/1986 | Korsunsky et al. | 439/73 |
| 4,717,347 | 1/1988 | Babow et al. | 439/330 X |
| 4,993,955 | 2/1991 | Savant | |
| 5,020,998 | 6/1991 | Ikeya et al. | 439/330 |
| 5,028,985 | 7/1991 | Matsuoka | 439/266 X |
| 5,088,930 | 2/1992 | Murphy | 430/330 X |

FOREIGN PATENT DOCUMENTS 0197376 10/1986 Fed. Rep. of Germany.
2205007 11/1988 United Kingdom.

Primary Examiner—Khiem Nguyen
Attorney, Agent, or Firm—Russell E. Baumann; Richard L. Donaldson; René E. Grossman

[57] ABSTRACT

A socket for use in the burn-in test, which is characterized in that a contact element and a fixed member are displaced from their original positions in connection with the forward motion of the cover member for charging an IC package into the main socket body. Upon the return of the fixed member and the contact element to their respective initial positions, the leads of the IC package are held between them, thereby carrying out the reliable fixing of the IC package. Additionally, the fixed member is integrally constructed with a compressive part of molded resin and a metal part that supports the compressive part.

9 Claims, 5 Drawing Sheets

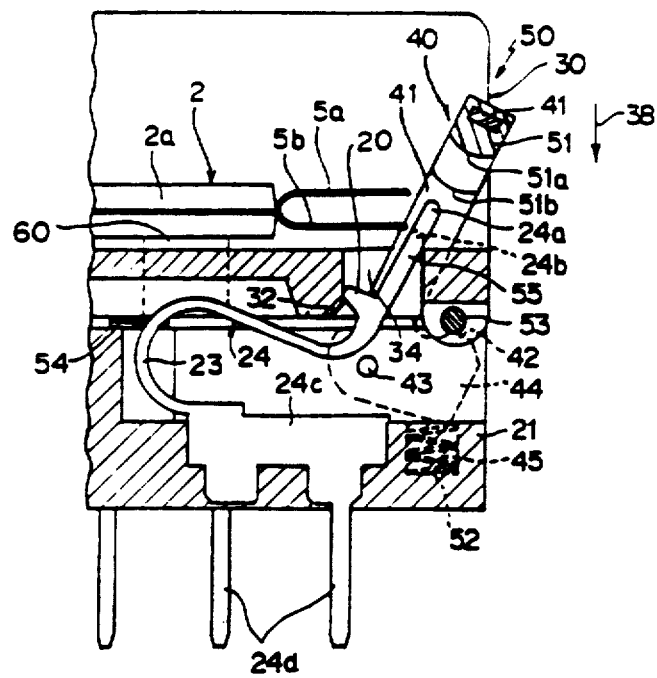
Fig. 3.
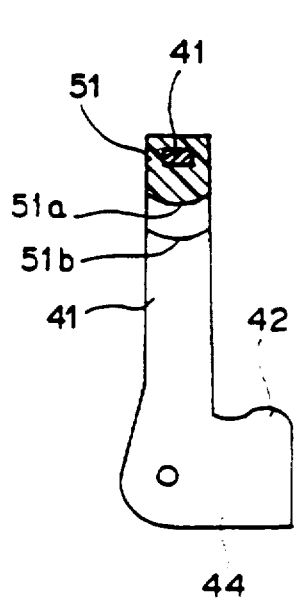
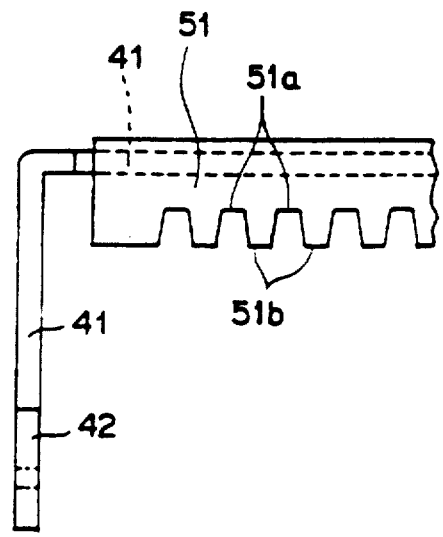
Fig. 4a.  Fig. 4b.

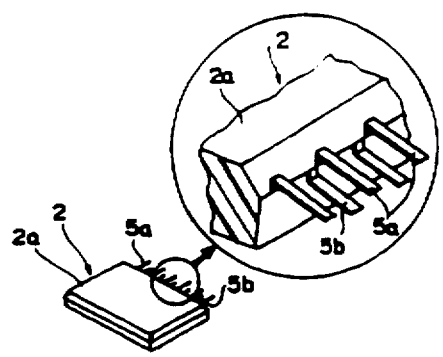
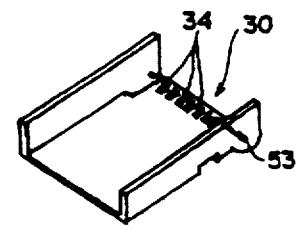
Fig. 2.
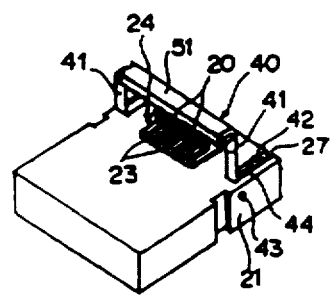
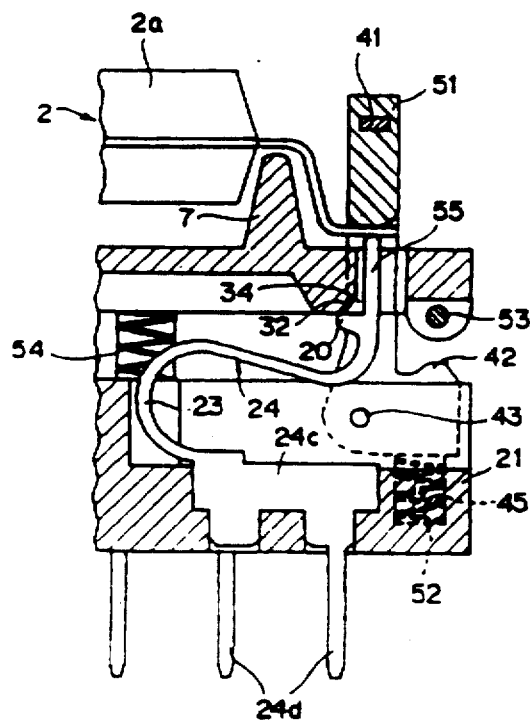
Fig. 8.

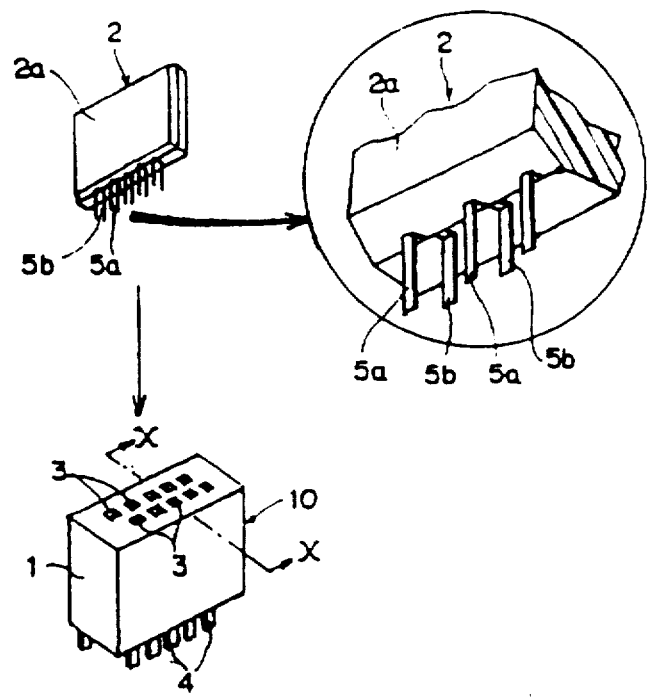
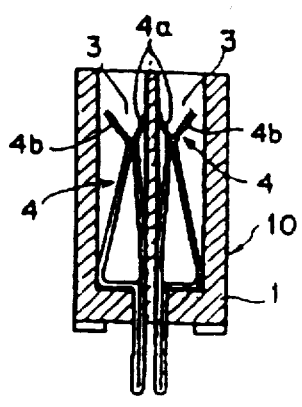
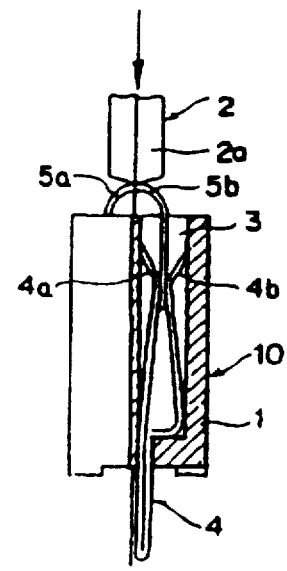
Fig. 9.
Fig. 10.
Fig. 11.

SOCKET

This application is a continuation of application Ser. No. 07/893,488, filed Jun. 5, 1992.

BACKGROUND OF THE INVENTION

This invention relates to a socket having a contact element which is to be elastically compressed to an electrical part so as to establish electric contact in connection with the installation of a semiconductor integrated circuit chip (IC) by inserting a molded IC package such as for example, a socket for IC chip use.

As the IC package has become thinner and smaller in size in recent years, and as applications for surface installations have increased, the quality of the product has become more difficult to control. This situation makes for testing and the elimination of unacceptable products very important.

With this fact in mind, standard testing (such as a heat resistant test that is called a burn-in test) of IC packages including IC packages for surface installation is performed in which IC packages are placed in a testing furnace so as to distinguish the good from the bad products.

One type of socket as known in the prior art used for such testing is the so-called ZIP (zig-zag in-line package) socket 10 which is shown in FIGS. 9 through 11. An IC package 2 which is installed on this ZIP socket is designed so that the loads 5a and 5b extending from the bottom of the molded resin portion of the IC 2a are in two rows for insertion into the socket 10 as clearly shown in FIG. 9. The contact element 4 of the socket is formed as a single metal piece which is bent back at its lower end with the bent part being inserted into the base of the socket.

For installation of the IC package, the IC package 2 is faced in the perpendicular direction and the leads are inserted into the respective lead insertion holes 3 corresponding to the various leads. Each lead is inserted between the mutually facing elastic holding parts 4a and 4b of the pin-shaped contact element 4 that has been positioned in the lead insertion hole 3 so as to elastically hold the lead as shown in the drawings. An action opposite to that described above is carried out in order to withdraw the IC package 2 from the socket.

It has been found, however, that the aforementioned ZIP socket has certain shortcomings. In an automated operation for insertion and withdrawal from the socket, the IC package may be positioned sideways on the tray because of its shape which requires that the packages have to be repositioned in the perpendicular (vertical) direction before they are inserted into the socket with the consequence that the steps required for automation become more complicated. Additionally, the leads 5a and 5b of the IC are pushed into the gap between the mutually facing holding parts 4a and 4b thereby separating these holding parts and giving rise to the possibility of the leads and contacts being deformed.

BRIEF SUMMARY OF THE INVENTION

In accordance with the present invention, an electrical parts (IC) are charged into the main socket body by displacing a contact element and a fixed member in connection with the forward motion of the reciprocating motion member, and thus the fixing of said electrical parts and specifically the terminal part upon the return motion of the reciprocating member. The leads, therefore, of the electrical part are not pressed or inserted into the contact point but held in position between the contact element and the fixed member upon return of the contact member and specifically the contact point to its original position. This design allows for the contacting of all the connective terminal parts of the electrical parts under the same contact pressure and best provides for sufficient contact pressure.

It is an object of this invention to provide a socket with uniform and satisfactory contact pressure which can be reduced in size so as to easily mount and dismount an electrical part such as an IC chip by an automatic tool, which is capable of being used in common for various lead lengths and shapes, and in which the external size of the socket can be reduced for improved installation density.

Briefly described, the socket of this invention comprises a socket having a contact element which is electrically connected in a compressed state to the connective terminal part of a prescribed electrical part that is to be installed in a socket, a fixed member that holds the connective terminal part of the electrical part between it and the contact element and a reciprocating motion member mounted on the main socket body in such a manner as to be adapted for reciprocating motion with the contact element and the fixed member to displace them from their original positions in connection with the forward motion of the reciprocating motion member, thereby providing for insertion of the electrical part into the main socket body, and upon the return of the fixed member and the contact element to their original position, the connective part of the electrical part is held between the fixed member and the contact element so as to carry out the electrical connection of the connective terminal part to the contact element. Preferably the fixed member is formed integrally with a resin molded part or the like that is in direct contact with the connective terminal part and a metal part that supports the resin molded part. It is further understood that in accordance with this invention that the reciprocating motion can be carried out simultaneously with the fixing of the electrical part or as an alternative in the wake of the fixing of the electrical part.

DESCRIPTION OF THE DRAWINGS

Other objects, advantages and details of the socket of this invention appear in the following detailed description of preferred embodiments of the invention, the detailed description referring to the drawing in which:

FIG. 3 is a cross-section of the socket of FIG. 1 in the full stroke position;

FIG. 4(a) shows a partial cross section of the fixed member latch of the present invention;

FIG. 4(b) shows a front view of the latch of FIG. 4(a);

FIG. 7 is a dismantled oblique view partially exploded of an IC package and the socket of this invention;

FIG. 8 is a cross-sectional view of the essential part of another embodiment of this invention;

FIG. 9 is a dismantled oblique view partially exploded of an IC package and a soc of the prior art;

FIG. 10 is a cross-sectional view cut along line X—X of FIG. 9; and

FIG. 11 is a half cross-sectional view of FIG. 10 where the IC package has been inserted into the socket.

FIGS. 1-7 show the ZIP socket 50 for use in testing an IC. A contact element 24 is formed of an electroconductive material. It comprises a fixed terminal part 24c mounted in a base 21 of the main socket body, a lead part 24d which protrudes downward from the fixed terminal part 24d, an elastic bent part 23 generally in the form of an arc which is joined to the fixed terminal part 24c, a sliding contact part 20 which is linked to the bent end of the bent part 23 and contact points 24a and 24b.

Figure 1:
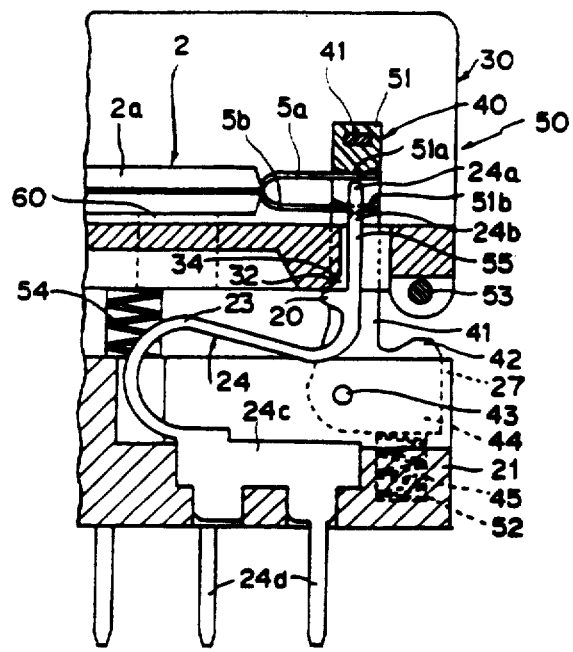
FIG. 1 is a cross-section of the essential part of a socket according to the invention.

These contact points 24a and 24b are arranged to have different heights so as to conform with the leads 5a and 5b of the IC to be provided at the top of an erect part 55 that runs upward through each of the through holes that are formed in a cover member 30 that will be described later.

A fixed latch member 40 which sandwiches and holds the leads 5a1 and 5b of the IC package 2 with the molding and IC chip against the contact points of the contact element 24 comprises a lever part 41 (see FIG. 7) which stands erect in the form of an "U" from the fulcrum pin 43 which is fixed to the main socket body 21, a linking part 44 which is linked in the right angle direction as compared with this lever part 41, and a protruding part 42 which protrudes upward from this linkage part 44.

Lever part 41 and link part 44 are typically made from a metal such as stainless steel, etc., and the lead compression part 51 which has been provided at the top of the lever part 41 is made from a molded resin such as epoxy resin, etc., (see FIG. 4). The lead compression part 51 has a compressive surface where the concave part 51a and the convex part 51b corresponding to the various leads 5a and 5b of the IC are arranged alternately. The compressive surface of the concave part 51a and convex part 51b are generally spherical.

A coil spring 45 is combined in a cavity 52 formed in the main socket body 21 with the top of the spring 45 in contact with the linkage part 44 of the fixed member 40 thereby giving impetus in the counter clockwise direction (see FIG. 1). Additionally, linkage part 44 of fixed member 40 is arranged inside a groove 27 that has been provided on the base 1.

The reciprocating cover member has a hole 34 for the insertion of sliding part 20 of contact 24 with an inclined surface 32 being provided in hole 34 upon which part 20 slides. A surface 60 for receiving the IC package 2 is provided on the main socket body 21 so that the IC package 2 may not be lowered beyond a certain fixed height.

At the lower end of the cover member 30, there is fixed a shaft 53 as a compressive member that is in contact with protruding part 42 of linkage part 44 that has been described earlier and that drives same (see FIGS. 1-3).

Figure 5:
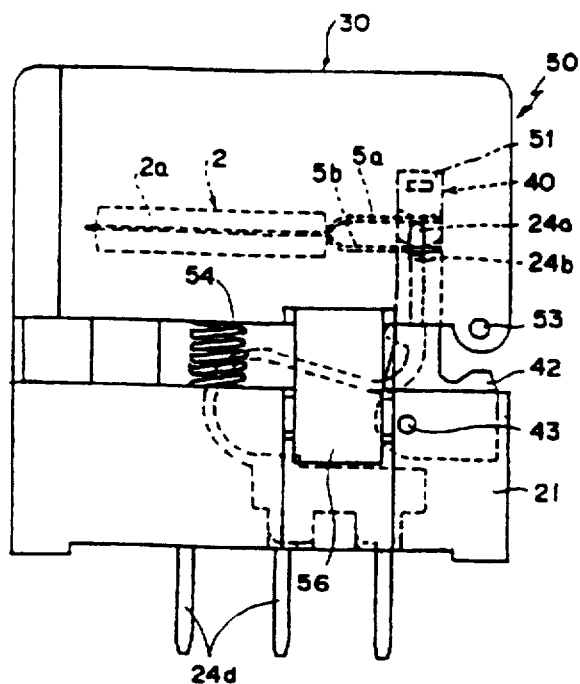
FIG. 5 is a front view of the socket according to this invention.

Even though the cover member 30 is capable of engaging in reciprocating motion up and down, as compared with the base 21, it is given an upward impetus at all times by a spring 54 that has been provided on the base 21. It is mentioned in this connection that item 56 in FIG. 5 indicates a stopper for stopping the cover member 30 from escaping upward.

In the paragraph below the action for the inserting of the IC package 2 in the main socket body will be explained.

Figure 2:
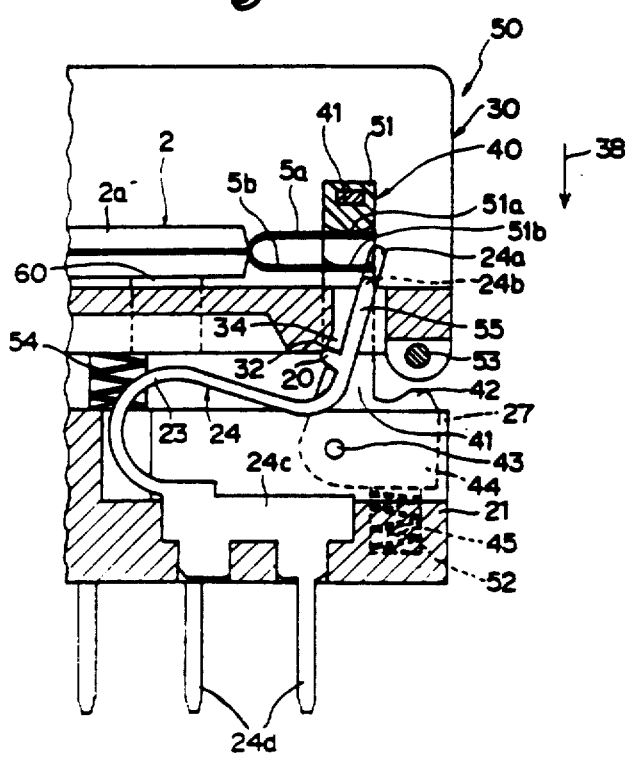
FIG. 2 is a cross-section of the socket of FIG. 1 with the contacts in the open position.

As shown in FIG. 2, the cover 30 that has been installed at a prescribed location on the main socket body 21 moved lower in the direction indicated by an arrow 38 from the position in the normal state shown in FIG. 1 by means of an external force.

At this time, the sliding part 20 of the contact element 24 moves in the clockwise direction, while sliding on the inclined surface 32. At the same time, the contact points 24a and 24b move in the same direction to separate from lead 5. A force is required to some extent at this time for the elastic deformation of the contact in connection with this movement; however, that force does not have to be big in view of the shape which has been described above.

When the cover 30 is moved downward, a shaft 53 which is located a the bottom of the cover member 30 contacts the protruding part 42 of the fixed member 40. If the cover member 30 is further moved downward in the direction indicated by arrow 38, the protruding part 42 is pushed down by the cover member 30, with the result that the lever 41 of fixed member 40 rotating in the clockwise direction in opposition to the spring force of spring 45 thereby allowing IC package 2 to be inserted or withdrawn. By further pushing down the cover member 30 until it contacts the main socket body 21, the fixed member 40 (lever 41) is brought into a fully open state as shown in FIG. 3.

In the state of the fixed member (lever 41) being wide open as described above, the IC package 2 is inserted into the cover member 30 and the IC package 2 is charged to a prescribed position in the main socket body.

Then by releasing the force that pushes down the cover member 30 thereafter, the fixed member 40 and the contact element 24 and further the cover member 30 move in a direction which is opposite to the above-described movement to be restored to the original position.

In other words, upon releasing the external force, the restoring force of the spring 45 which is in the compressed state causes the fixed lever 41 to rotate in the counter clock-wise direction to restore the socket to the original position. Moreover, the sliding part 20 of the contact element 24 slides along the wall surface of the through hole 34 so that the cover 30 is pushed to the original position by the elastic restoring force of the spring 54. Also, contact element 24 tries to return to the original shape shown in FIG. 1 as sliding part 20 moves from the bottom of the through hole 34.

As a result of the above-described return movement, the contact element 24 is returned back to the original position as is fixed member 40 and the contact points 24a and 24b come into contact from below with the leads 5a and 5b that are located under the fixed member 40 and, as is shown in FIG. 1, the leads 5a and 5b are brought into the state where they are held between the compressive surfaces 51a and 51b of fixed member 40 and the contact points 24a and 24b respectively.

Figure 6:
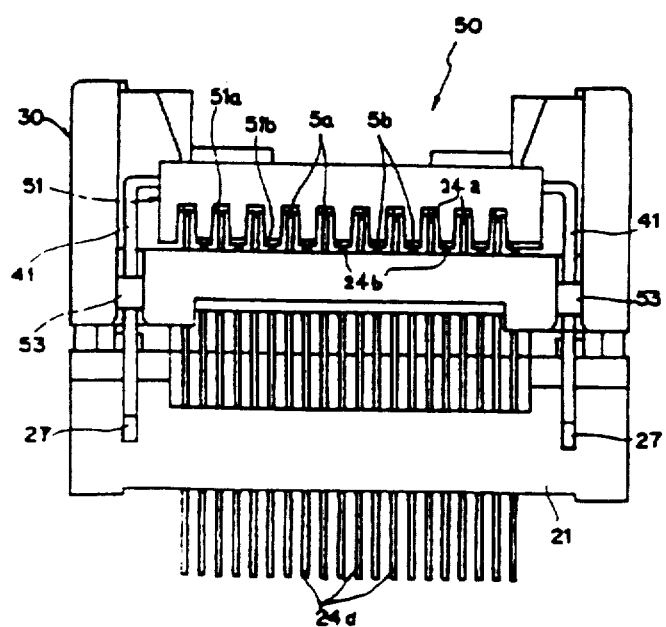
FIG. 6 is a side view of the socket of FIG. 5.

FIGS. 1-3 show the state where the IC package 2 has already been installed. The above explanation generally describes the method for inserting the IC package in a non-installed state into a socket (additionally see FIGS. 5-7). For removal of the IC package 2, the procedure as described above would be done in reverse.

It can be seen from what has been explained above that the socket according to this invention has the following advantages:

(1) The socket is so constructed that the contact element 24 and fixed member 40 are displaced from the original position upon the downward movement of the cover member 30 by an external force thereby providing for the insertion of an IC package 2 into the main body 21. When the fixed member 40 and the contact element 24 are returned to their original positions respectively, the IC package 2 is contained in the main socket body 21 with a hold on leads 5a and 5b.

Accordingly, it is not that leads 5a and 5b are pushed into contact with the contact points 24a and 24b or that the leads are inserted between the contact points but that, subsequent to the fixing of the IC package 2, the contact points 24a and 24b are restored by their own strength contacting the leads 5a and 5b from underneath and thereby pushing up the leads by the spring force of the contact element 24 itself, while the top of the lead is compressed or held by the compressive part 51 of the fixed member 40 so that the leads will not rise unnecessarily.

Since the various leads are elastically held between the fixed member 40 and the contact element 24, the contact pressure by the contact element 24 is controlled and sufficient. Moreover, since contact is established under the same contact pressure for both of the leads 5a and 5b which are arranged in a zig zag fashion, there is minimal variation in the contact pressure between the leads with a sufficient contact pressure being obtained. Thus, there will be no bending or non-alignment of the leads and also the contact element 24 does not produce any deformation such as a bending, etc.

(2) The socket has a construction to hold the leads 5a and 5b from above and below. This construction allows for accurately holding of the leads even if the lead length may change or vary because the leads merely extend out from the holding position. That is, irrespective of the length of the lead or shape thereof, the design provides for accurately holding the leads under a prescribed contact pressure so that one kind of socket can be used in common for different kinds of IC packages.

(3) In connection with insertion of the IC package 2, it is possible to do same without the addition of any force to the IC package so long as the socket is in the state as shown in FIG. 3. This feature is important to ensure that contact element deformation does not take place. This feature is especially noteworthy and beneficial for IC's where the leads are arranged in a zig-zag fashion.

In addition it becomes possible to remove the IC package 2 in its horizontal state by such means as vacuum suction, etc., and insert same into the socket, thereby making it possible to reduce assembly and disassembly time.

(4) The socket of the present invention has good dimensional accuracy and mechanical strength along with good electrical insulation properties by providing for fixed member 40 to hold the leads which is formed integrally with a compressive portion 51 made of molded resin and a lever portion 41 made of metal which are joined together. That is, it would be ideal to form the fixed member from a material of high strength so that the socket can be made of minimal size. However, such a fixed member needs to exhibit dimensional accuracy and provide the needed insulation. Accordingly, the lever part 41 is made out of metal thereby adhering the reduction in size with the part that directly presses against the leads being made from an electrically insulating material formed by forming it to the metal portion.

As compared with the fixed member being made entirely from molded resin, it becomes possible to reduce the dimensions of the fixed member and thus the socket itself. It is then possible to improve the installation density of the sockets on the board for testing and, at the same time, it becomes possible to realize both insulation and dimensional accuracy required.

Accordingly, the joining of the lever part 41 and the compressive part 51 can be carried out as follows: First, the lever part 41 is prepared by using a metal of desired size to which compressive portion 51 is molded as by the insert molding process. Alternatively, a hole for insertion can be provided on the molded compressive part 51 with the lever part 41 compressively joined thereto.

(5) To further provide reduced size of the socket, both sliding part 20 and the contact points 24a and 24b have been provided on an erect part 55 that extends upward up from the bent part 23 of the contact element 24 so that the size is reduced in the horizontal direction of the contact element 24 as a whole and, thus the size of the socket becomes smaller.

(6) The IC package 2 can be inserted into the main socket body 21 by means of a simple action involving the reciprocating motion of the cover member 30. Accordingly, there is no need for carrying out complicated steps. This feature is highly advantageous from the standpoint of promoting automation. Even using an automatic tool, etc., the IC package 2 can be fixed on the main socket body 21.

An alternate embodiment of this invention will now be explained in reference to FIG. 8. In this embodiment there is provided a socket for the SOP (small outline package) in which the leads 5 of the IC package 2 have the same shape and are taken out in one direction and that the package 2 can be positioned by means of a protruding part 7 that is provided on main body 21. The other construction remains the same as the above-described socket. It is pointed out, however, that the compressive surface of compressive part 51 of fixed member 40 has a straight shape.

Additionally, the socket of this embodiment is functional for packages having different lead lengths, provided that the dimensions of the mold part 2a of the IC package 2 are equal as is set forth above. In the case where the dimensions of the mold part 2a are different, the common use of the socket becomes possible only if the IC package is accommodated in an adapter and said adapter is charged into the socket.

In the construction of this embodiment as with that described earlier, the leads are held from above and below making it possible to charge the IC package without producing any deformation of the lead and contact element while assuring proper contact pressure.

Thus, in accordance with the present invention, the electrical parts (IC) are charged into the main socket body by displacing the contact element and the fixed member in connection with the forward motion of the reciprocating motion member, with the fixing of said electrical parts and specifically the terminal part upon the return motion of the reciprocating member. The leads, therefore, of the electrical part are not pressed or inserted into the contact point but held in position between the contact element and the fixed member upon return of the contact member and specifically the contact point to its original position. This design allows for the contacting of all the connective terminal parts of the electrical parts under the same contact pressure and best provides for sufficient contact pressure.

Moreover, operation for the fixing of the electrical parts can be carried out easily by a simple reciprocating motion without requiring a complicated action, with a consequence that it is easy to effect automation by using an automatic machine. Since the reciprocating motion construction is based on the reciprocating motion member, further, it becomes possible to reduce the size of the socket itself.

Still further, since the connective terminal part is held in this structure, said holding can be carried out accurately at a prescribed location at all times even when the length of the lead or terminal part may vary or when the lengths are different. Irrespective of the length (and the shape) of the connective terminal part, the holding of the part can be carried out accurately at all times and one kind of sockets can be used commonly for a plurality of electrical parts.

Lastly, in accordance with this invention, the fixed member for holding of the leads is made with two integral portions with the compressive part of the molded resin and the resilient part of metal. This provides for good mechanical strength along with satisfactory electrical insulation and sufficient dimensional accuracy, thereby making it possible to reduce the dimensions of the fixed member and thus the outer dimensions of the socket itself. This then results in improved socket installation density on the board for testing and, at the same time, both good insulation and dimensional accuracy.

The invention has been illustrated above by the description of specific examples. It should be added that further modifications can be made still within the scope of this invention. For example, the shape, material and the installation location, etc., of the contact element and fixed member can be modified. In addition, the shape, material and structure of the cover member (reciprocating motion member) may also be changed. With regard to the structure and material of the fixed member, various methods for the integration of the lever part and the mold part can be adapted as materials can be suitably selected taking into consideration durability, insulation properties, workability, etc. In addition, the material shapes and structures of the main body can be suitably selected.

By way of example in this invention, the IC chips were inserted and fixed in the main socket body by reciprocating the cover member in the vertical direction. However, it does not have to be always in the vertical direction. For instance, the same purpose can be achieved by reciprocating it suitably in the horizontal direction.

There may be a time lag between the fixing of the IC chip and the return of the cover member to the original position or they may be carried out simultaneously. In addition, the shape, installation method and the kind of spring that is provided between the fixed member and the main socket body may also be modified.

This invention can be used in the QFP (quad flat package) and two-member forms, etc, in addition to the IC package of the aforementioned type (with the load exposed to one member side). In the case of a two member shape, it is only necessary to install the fixed member shown in FIG. 7 on the side of two opposing members in the same manner, with the cover member being used in common. It goes without saying that this invention can be used for the electrical parts other than the aforementioned IC chips.

I claim:

1. A socket for mounting an integrated circuit chip without a carrier member to electrically connect a lead on a chip into an electrical circuit, the socket comprising a main body, a contact element mounted on said main body and adapted to make contact with said lead on said chip, a fixed member mounted in said main body and adapted to directly hold and make contact with said lead when said contact element contacts said lead and a reciprocating motion member movably attached to said main socket body to reciprocally move back and forth from a first position to a second position associated with said contact element and fixed member, so that as the reciprocating motion member moves from the original first position to the second position said contact element and fixed member are displaced from an original first position to an open second position for allowing easy charging of said chip and then upon return of said reciprocating motion member from said second position to said first position said contact element and fixed member return back to said first position thereby precisely holding the lead of said chip between said contact member and said fixed member so as to carry out electrical connection between the lead and said contact element without producing any deformation of the lead.

2. A socket according to claim 1 wherein there are a plurality of contact elements and a plurality of fixed members for holding a plurality of leads.

3. A socket according to claim 1 wherein said fixed member is made with two integral portions.

4. A socket for mounting an integrated circuit chip to electrically connect a lead on a chip into an electrical circuit, the socket comprising a main body, a contact element mounted on said main body and adapted to make contact with said lead on said chip, a fixed member having a compressive part for contacting said lead and a resilient part for strength mounted on said body and adapted to hold said lead when said contact element contacts said lead part and a reciprocating motion member installed on said main socket body to reciprocally move back and forth from a first position to a second position associated with said contact element and fixed member, so that as the reciprocating motion member moves from the original first position to the second position said contact element and fixed member are displaced from an original first position to an open second position for allowing easy charging of said chip and then upon return of said reciprocating motion member from said second position to said first position said contact element and fixed member return back to said first position thereby precisely holding the lead of said chip between said contact member and said fixed member so as to carry out electrical connection between the lead and said contact element without producing any deformation of the lead.

5. A socket according to claim 4 wherein said resilient part is made from metal and fixedly attached to the compressive part at one of its ends.

6. The socket according to claim 1 wherein said reciprocating motion member is a cover member movably attached to the socket body.

7. The socket according to claim 5 wherein said reciprocating motion member comprises a cover member movably attached to the socket body and which is biased away from said socket body when no external force is applied and held at a predetermined position by a stop member.

8. A socket according to claim 4 wherein there are a plurality of contact elements and a plurality of fixed members for holding a plurality of leads.

9. A socket according to claim 4 wherein said reciprocating motion member is a cover member movably attached to the socket body.

* * * * *